United States Patent
Kim

(10) Patent No.: US 9,136,860 B2
(45) Date of Patent: Sep. 15, 2015

(54) SYSTEM AND METHOD FOR SETTING OFFSET AND GAIN OF ANALOG INPUT MODULE

(71) Applicant: LSIS CO., LTD., Anyang-si, Gyeonggi-do (KR)

(72) Inventor: Jung Wook Kim, Cheonan-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 14/597,047

(22) Filed: Jan. 14, 2015

(65) Prior Publication Data
US 2015/0214971 A1    Jul. 30, 2015

(30) Foreign Application Priority Data
Jan. 27, 2014  (KR) .......................... 10-2014-0009479

(51) Int. Cl.
    H03M 1/12    (2006.01)
    H03M 1/18    (2006.01)
(52) U.S. Cl.
    CPC ............... *H03M 1/186* (2013.01); *H03M 1/12* (2013.01)
(58) Field of Classification Search
    CPC ......... H03M 1/12; H03M 1/186; H03M 1/08; H03M 1/1028; H03M 1/0617; H03M 1/58; H03M 1/183; H03M 1/187; H03M 1/1009; H03M 3/494; H04L 27/364; H04N 1/0411; H04N 1/1912; H04N 1/46; H04N 1/045; H04N 1/0455; H04N 1/1917; H04N 1/1918; H04N 1/4076
    USPC .......... 341/118, 120, 139, 154, 155; 375/298; 358/474, 529, 516, 506; 348/97, 348/E5.081, E3.027, E9.01
    See application file for complete search history.

(56) References Cited

U.S. PATENT DOCUMENTS

| | | | | |
|---|---|---|---|---|
| 4,937,575 A | * | 6/1990 | Kummer | 341/118 |
| 5,644,308 A | * | 7/1997 | Kerth et al. | 341/120 |
| 5,706,050 A | * | 1/1998 | Nishimura et al. | 348/97 |
| 6,011,762 A | * | 1/2000 | Watanabe et al. | 369/44.27 |
| 6,252,536 B1 | * | 6/2001 | Johnson et al. | 341/155 |
| 6,707,492 B1 | * | 3/2004 | Itani | 348/229.1 |
| 6,911,924 B2 | * | 6/2005 | Kurachi et al. | 341/120 |

(Continued)

FOREIGN PATENT DOCUMENTS

KR    10-2000-0056025    9/2000

OTHER PUBLICATIONS

Korean Intellectual Property Office Application Serial No. 10-2014-0009479, Office Action dated Dec. 29, 2014, 3 pages.

*Primary Examiner* — Lam T Mai
(74) *Attorney, Agent, or Firm* — Lee, Hong, Degerman, Kang & Waimey

(57) ABSTRACT

The present disclosure relates to a system for setting offset and gain of an analog input module, the system configured to set the offset and gain of the analog input module by outputting an offset value and a gain value to the analog module, using the analog module formed with a plurality of channels. The system includes a control unit configured to output a control signal for outputting the offset value and the gain value, a setting value providing unit configured to output a setting signal by the control signal from the control unit, wherein the setting signal is in a form of a pulse including the offset value and the gain value, and relay unit configured to be switched for applying the setting signal to the analog input module by the control signal from the control unit.

6 Claims, 6 Drawing Sheets

(56) References Cited

U.S. PATENT DOCUMENTS

| | | | |
|---|---|---|---|
| 7,053,806 B1 * | 5/2006 | Rao et al. | 341/120 |
| 7,236,117 B1 * | 6/2007 | Varma et al. | 341/155 |
| 7,317,415 B2 * | 1/2008 | Kaiser | 341/155 |
| 8,847,578 B2 * | 9/2014 | Venkataraman et al. | 324/123 R |
| 2011/0316730 A1 * | 12/2011 | Kurachi | 341/120 |

* cited by examiner

FIG. 6

| INPUT RANGE | CONSUMED TIME FOR SETTING OFFSET AND GAIN [SECONDS] | | REMARKS |
| --- | --- | --- | --- |
| | CONVENTIONAL ART | EXEMPLARY EMBODIMENT OF THE PRESENT DISCLOSURE | |
| 0~5V | 37~38 seconds | below 2 seconds | BASED ON 4-CHANNEL ANALOG INPUT MODULE |
| -10~10V | 37~38 seconds | below 2 seconds | |
| 0~20mA | 38~39 seconds | below 6 seconds | |

SYSTEM AND METHOD FOR SETTING OFFSET AND GAIN OF ANALOG INPUT MODULE

Pursuant to 35 U.S.C. §119(a), this application claims the benefit of earlier filing date and right of priority to Korean Patent Application No. 10-2014-0009479, filed on Jan. 27, 2014, the contents of which are hereby incorporated by reference herein in its entirety.

BACKGROUND

1. Field of the Disclosure

The present disclosure relates to a system and a method for setting offset and gain of analog input module. More specifically, the present disclosure relates to a system for setting offset and gain of an analog input module, by concurrently reading and storing offset and gain using a pulse wave form.

2. Discussion of the Related Art

A factory system was conventionally operated by controlling a machine or a device singularly. However, as modern industries are increasingly varied and complicated, the change of system is required. That is, a device to safely operate important equipment of a complex system is required. Thus, a programmable logic controller (PLC) to directly control manufacturing lines has been developed.

The PLC is an electronic device to control various kinds of machines or processors by using a programmable memory. The PLC performs specialized functions such as logic, counting, sequencing, timing, counting, and calculating through a digital or analog input and output module.

In general, the PLC functions as a computer. The PLC receives signals from the machines, processes as programmed, and outputs the processed signals to the machines.

The PLC substitutes the controller functions such as relay, timer, and counter to semiconductor elements such as integrated devices and transistors, and may be applied to various operations such as device control, device value setting, real-time surveillance, real-time data collection, and driving safety devices.

The PLC includes an analog output module (digital-analog conversion module) to provide signals to the machines such as automation equipment, and an analog input module (analog-digital conversion module) to receive inputs from the machines.

The analog input module converts an analog signal provided from the machines to a digital signal and provides the digital signal to an internal execution processing unit. The analog output module receives a digital signal reflecting the execution processing result from the execution processing unit, converts the digital signal to an analog signal, and transmits the analog signal to the machines.

The analog input module included in the PLC detects various analog signals such as a predetermined pressure, flux, and temperature using a sensor such as a transducer while driving a load. The analog input module inputs and converts the detected analog signal to a digital signal, and outputs the digital signal to a PLC execution unit.

The analog input module measures a variety of electrical signals such as direct voltage in a range of 1V~5V, 0V~5V, 0V~10V, or −10V~10V, or alternating currents in a range of 0 mA~20 mA, or 4 mA~20 mA.

Therefore, it is required to set an offset and a gain to correct an input module circuit and to construct a system therefor, in order to precisely measure such values.

In a conventional art, offsets and gains are set by a method of inputting offset values in an order of channels according to input range of the analog input module and storing the offset values, and afterwards, inputting gain values and storing the gain values. This method has a problem of consuming a large amount of setting time.

SUMMARY OF THE DISCLOSURE

The present disclosure is disclosed to provide a system and a method for setting offset and gain of an analog input module to reduce consumed time for setting the offsets and gains, by concurrently reading and storing offset and gain using a pulse wave form.

In one general aspect of the present disclosure, there is provided a system for setting offset and gain of an analog input module configured to set the offset and gain of the analog input module by outputting an offset value and a gain value to the analog module, using the analog module formed with a plurality of channels, the system comprising: a control unit configured to output a control signal for outputting the offset value and the gain value; a setting value providing unit configured to output a setting signal by the control signal from the control unit, wherein the setting signal is in a form of a pulse including the offset value and the gain value; and a relay unit configured to be switched for applying the setting signal to the analog input module by the control signal from the control unit.

In some exemplary embodiments of the present disclosure, the relay unit may include: a plurality of positive voltage applying switches, each of the positive voltage applying switches being respectively connected to each of positive voltage terminals of the plurality of channels in the analog input module and commonly connected to the setting value providing unit through a positive voltage applying line; and a plurality of negative voltage applying switches, each of the negative voltage applying switches respectively being connected to each of negative voltage terminals of the plurality of channels in the analog input module and commonly connected to the setting value providing unit through a negative voltage applying line.

In some exemplary embodiments of the present disclosure, the setting signal may be a voltage signal in a pulse wave form, and the plurality of positive voltage applying switches and negative voltage applying switches is configured to be all switched-on and apply the voltage signal in a pulse wave form to the plurality of channels in the analog input module.

In some exemplary embodiments of the present disclosure, the setting signal may be a current signal in a pulse wave form, and a pair of a positive voltage applying switch and a negative voltage applying switch with respect to one channel from the plurality of positive voltage applying switch and negative voltage applying switch is configured to be switched-on and apply the current voltage signal in a pulse wave form to the channel.

In some exemplary embodiments of the present disclosure, each of the plurality of positive voltage applying switches and negative voltage applying switches may be configured to be sequentially switched-on and apply the current voltage signal in a pulse wave form to the plurality of channels in the analog input module.

In some exemplary embodiments of the present disclosure, a maximum value of the setting signal in a form of pulse may be set as a gain value, and a minimum value of the setting signal in a form of pulse is set as an offset value.

According to an exemplary embodiment of the present disclosure, consumed time for setting the offsets and gains may be reduced, by concurrently reading and storing offset and gain values using a pulse wave form.

BRIEF DESCRIPTION OF THE DRAWINGS

FIG. 6 is a table comparing offset and gain setting of an analog input module according to a conventional art and an exemplary embodiment of the present disclosure.

DETAILED DESCRIPTION

Figure 1:
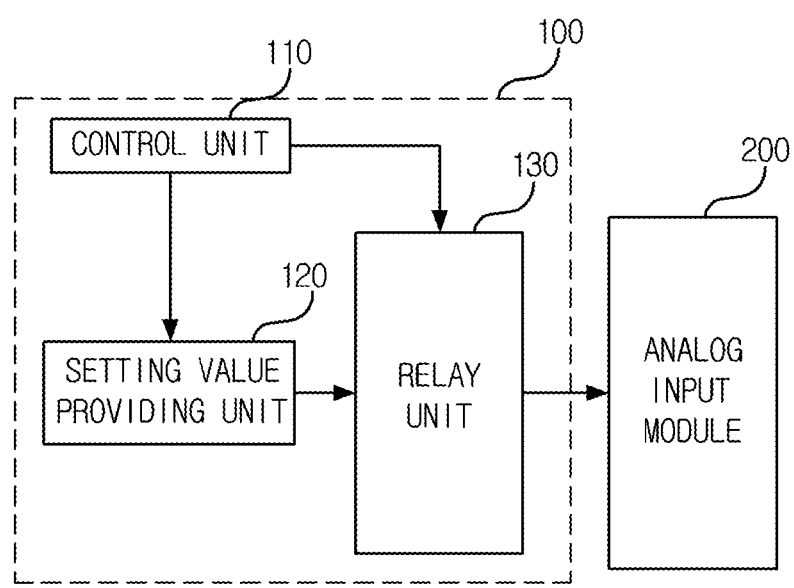
FIG. 1 is a block diagram illustrating a system for setting offset and gain of an analog input module according to an exemplary embodiment of the present disclosure.

Hereinafter, referring to enclosed figures, exemplary embodiment of the present disclosure will be described in detail so that persons skilled in the art may make and use the same. The thickness of lines and the size of components illustrated in the drawings may be exaggerated herein for clear and convenient description. In addition, terms to be mentioned in the following are defined in consideration of functions in the present disclosure, which may be varied according to the intention of a user or an operator, or practical customs. Therefore, the definition of the terms shall be made based on the overall contents of the present disclosure.

FIG. 1 is a block diagram illustrating a system for setting offset and gain of an analog input module according to an exemplary embodiment of the present disclosure.

Referring to FIG. 1, the system for setting offset and gain of an analog input module according to an exemplary embodiment of the present disclosure may be formed of a setting unit (100) and an analog input module (200).

The setting unit (100) sets offset and gain of the analog input module (200) by transmitting an offset value and a gain value to the analog input module (200). The analog input module (100) receives the offset value and gain value from the setting unit (100). According to the received offset value and gain value, the offset and gain of the analog input module (200) are set.

Meanwhile, the setting unit (100) may be formed of a control unit (110), a setting value providing unit (120), and a relay unit (130). The setting unit (100) may include additional components or structures.

The control unit (110) controls the setting value providing unit (120) and the relay unit (130). The control unit (110) outputs a control signal for the setting value providing unit (120) and the relay unit (130) to output a setting value.

Here, the control unit (110) may be formed of an operation unit for the user to input a control command to set offset and gain of the analog input module (200) and a display unit to display overall status of the system. For example, the control unit (110) may be realized as a personal computer (PC).

Meanwhile, when the control unit (110) outputs a control signal to the setting value providing unit (120) to output a voltage signal in a pulse wave form, the control unit (110) outputs a control signal to the relay unit (130) for all the switches to be concurrently switched-on.

Meanwhile, when the control unit (110) outputs a control signal to the setting value providing unit (120) to output a current signal in a pulse wave form, the control unit (110) outputs a control signal to the relay unit (130) for all the switches to be sequentially switched-on.

The setting value providing unit (120) outputs a setting signal including an offset value and a gain value of the analog input module (200), by operating according to the control signal transmitted from the control unit (110).

Meanwhile, the setting value providing unit (120) outputs a setting signal in a form of pulse. A maximum value and a minimum value of the setting signal in a form of pulse may be set as either one of a gain value or as an offset value.

Here, the maximum value of the setting signal in a form of pulse may be set as a gain value, and the minimum value of the setting signal in a form of pulse may be set as an offset value. In addition, the setting signal may be a current signal, or a voltage signal.

That is, the setting value providing unit (120) outputs a current signal in a form of pulse wave having a maximum value and a minimum value. Otherwise, the setting value providing unit (120) outputs a voltage signal in a form of pulse wave having a maximum value and a minimum value.

Figure 2:
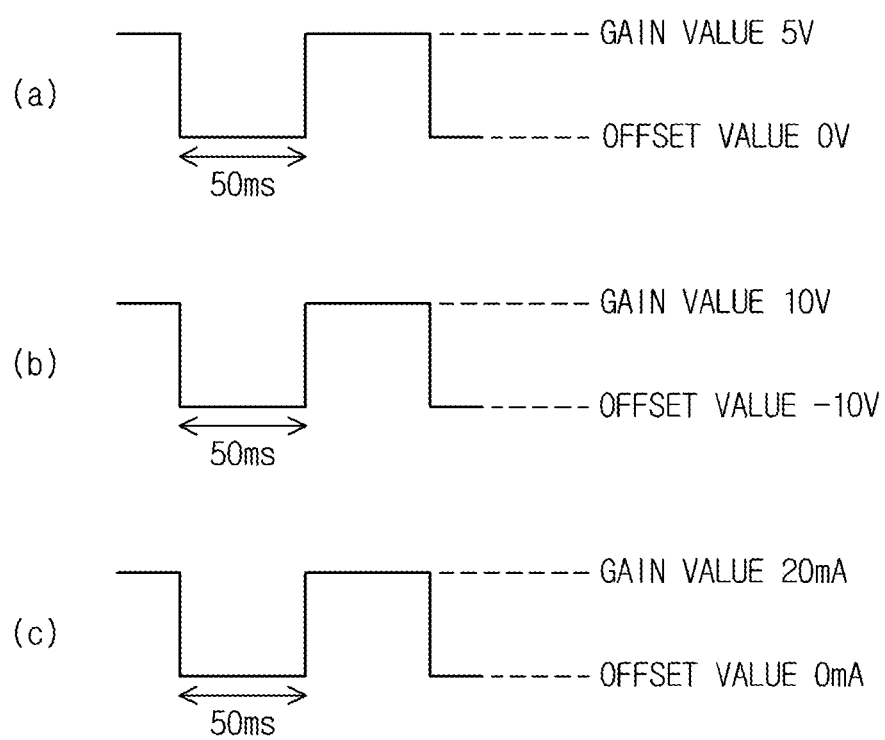
FIG. 2 is a view illustrating examples of setting values according to an exemplary embodiment of the present disclosure.

FIG. 2 is a view illustrating examples of setting values according to an exemplary embodiment of the present disclosure. FIG. 2(a) is a view illustrating a pulse wave form when a gain value is 5V, and an offset value is 0V. FIG. 2(b) is a view illustrating a pulse wave form when a gain value is 10V, and an offset value is −10V. FIG. 2(c) is a view illustrating a pulse wave form when a gain value is 20 mA, and an offset value is 0 mA.

Here, although the pulse interval of each pulse wave form is 50 ms in the present exemplary embodiment, the pulse interval of each pulse wave form may be set as a variety of values according to the system to which it will be applied.

Meanwhile, the relay unit (130) provides a setting signal outputted from the setting value providing unit (120) to each channel of the analog input module (200), by operating according to the control signal transmitted from the control unit (110).

Here, the relay unit (130) is formed of a plurality of channels and a plurality of switches connected to each of the channels, respectively. The plurality of switches may be formed differently by cases where the setting signal is a current signal, or otherwise, the setting signal is a voltage signal.

Hereinafter, although an analog input module formed of four channels (channel 0~channel 3) is described in the present exemplary embodiment, the number of channels in the analog input module may vary according to the system to which it will be applied.

Figure 3:
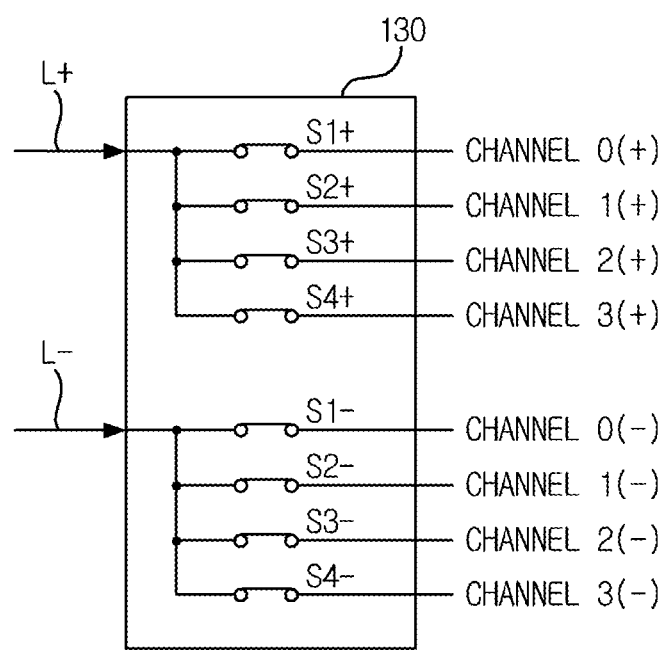
FIG. 3 is a block diagram illustrating a status of a relay unit when setting offset values and gain values by applying a voltage signal according to an exemplary embodiment of the present disclosure.

FIG. 3 is a block diagram illustrating a status of a relay unit when setting offset values and gain values by applying a voltage signal according to an exemplary embodiment of the present disclosure.

The relay unit (130) is applied a setting signal by being connected to the setting value through a positive voltage applying line (L+) and a negative voltage applying line (L−).

The relay unit (130) is formed of a plurality of switches to apply the setting signal to each of the channels in the analog input module, respectively. More specifically, the relay unit (130) is formed of a plurality of positive voltage applying switches (S1+~S4+) to apply a positive voltage and negative voltage applying switches (S1−~S4−) to apply a negative voltage switch, by being respectively connected to a plurality of channels (channel 0~channel 3).

Here, one side of each of the positive voltage applying switches (S1+~S4+) is connected to each of positive voltage terminals of the plurality of channels (channel 0~channel 3), respectively.

In addition, the other side of each of the positive voltage applying switches (S1+S4+) is arranged in a parallel structure by being commonly connected to the positive voltage applying line (L+).

Likewise, one side of each of the positive negative applying switches (S1−~S4−) is connected to each of negative voltage terminals of the plurality of channels (channel 0~channel 3), respectively.

In addition, the other side of each of the negative voltage applying switches (S1−~S4−) is arranged in a parallel structure by being commonly connected to the negative voltage applying line (L−).

Meanwhile, when a voltage signal in a pulse wave form is applied as illustrated in FIG. 3, the plurality of positive voltage applying switches (S1+~S4+) and negative voltage applying switches (S1−~S4−) are all switched-on and concurrently applied to each of the channels (channel 0~channel 3).

The analog input module (200) sets a maximum value of the voltage signal in a pulse wave form as a gain value of each channel, and sets a minimum value of the voltage signal in a pulse wave form as an offset value of each channel, by receiving the applied voltage signal in a pulse wave form.

Through this process, a gain value and an offset value may be read and set concurrently using a single pulse wave form. Thus, the consumed time for setting a gain value and an offset value may be reduced.

Figure 4:
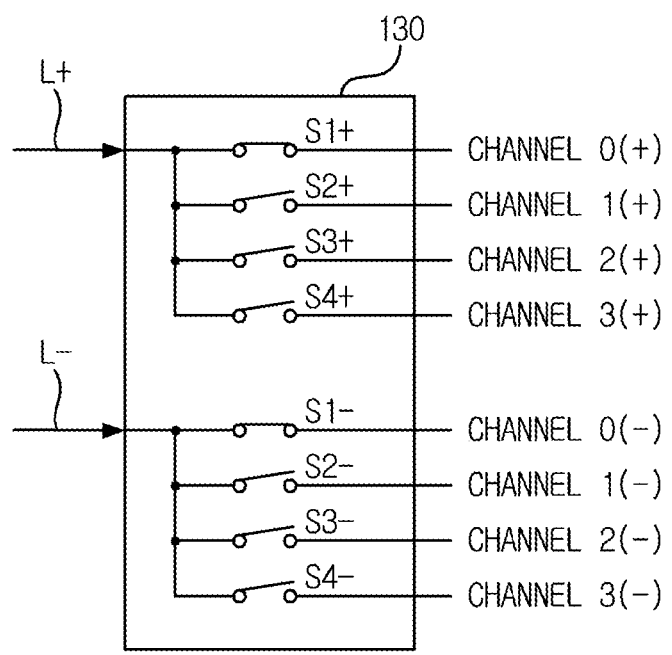
FIG. 4 is a block diagram illustrating a status of a relay unit when setting offset values and gain values by applying a current signal according to an exemplary embodiment of the present disclosure.

FIG. 4 is a block diagram illustrating a status of a relay unit when setting offset values and gain values by applying a current signal according to an exemplary embodiment of the present disclosure.

The relay unit (130) is applied a setting signal by being connected to the setting value providing unit (120) through a positive voltage applying line (L+) and a negative voltage applying line (L−).

The relay unit (130) is formed of a plurality of switches to apply the setting signal to each of the channels in the analog input module, respectively. More specifically, the relay unit (130) is formed of a plurality of positive voltage applying switches (S1+~S4+) to apply a positive voltage and negative voltage applying switches (S1−~S4−) to apply a negative voltage switch, by being respectively connected to a plurality of channels (channel 0~channel 3).

Here, one side of each of the positive voltage applying switches (S1+~S4+) is connected to each of positive voltage terminals of the plurality of channels (channel 0~channel 3), respectively.

In addition, the other side of each of the positive voltage applying switches (S1+S4+) is arranged in a parallel structure by being commonly connected to the positive voltage applying line (L+).

Likewise, one side of each of the positive negative applying switches (S1−~S4−) is connected to each of negative voltage terminals of the plurality of channels (channel 0~channel 3), respectively.

In addition, the other side of each of the negative voltage applying switches (S1−~S4−) is arranged in a parallel structure by being commonly connected to the negative voltage applying line (L−).

Meanwhile, when a current signal in a pulse wave form is applied as illustrated in FIG. 4, only one pair of positive voltage applying switch (S1+) and negative voltage applying switches (S1−) corresponding to a channel (channel 0) are switched-on and applied to the channel (channel 0).

At this moment, the plurality of positive voltage applying switches (S1+~S4+) and negative voltage applying switches (S1−~S4−) are sequentially switched-on and apply the current signal in a pulse wave form to each of the channels (channel 0~channel 3).

The analog input module (200) sets a maximum value of the current signal in a pulse wave form as a gain value of each channel, and sets a minimum value of the current signal in a pulse wave form as an offset value of each channel, by receiving the applied current signal in a pulse wave form.

Through this process, a gain value and an offset value may be read and set concurrently using a single pulse wave form. Thus, the consumed time for setting a gain value and an offset value may be reduced.

Figure 5:
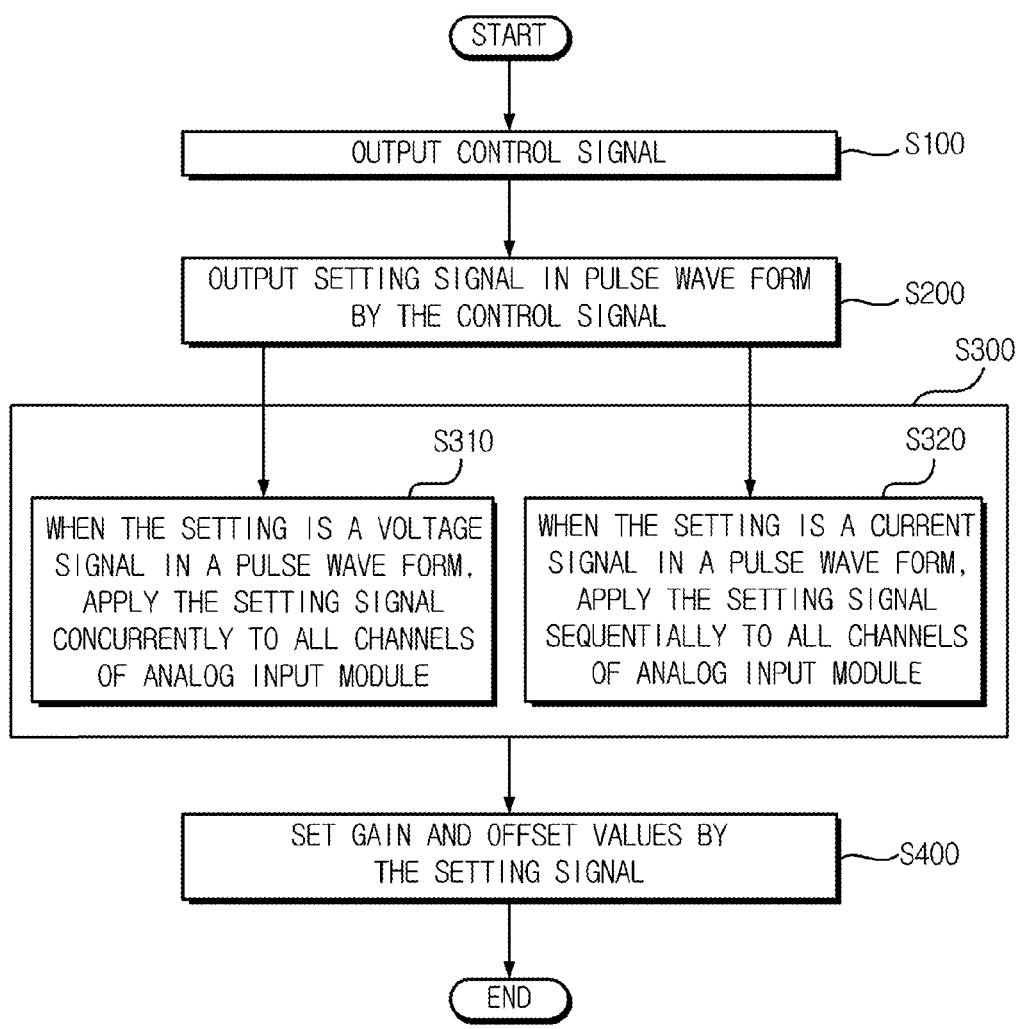
FIG. 5 is a flow chart illustrating a method for setting offset and gain of an analog input module according to an exemplary embodiment of the present disclosure.

FIG. 5 is a flow chart illustrating a method for setting offset and gain of an analog input module according to an exemplary embodiment of the present disclosure.

Referring to FIG. 5, at first, the control unit (110) outputs a control signal to set an offset and a gain of the analog input module (200) by operation of the user (S100: control signal output step).

When the control signal is outputted by the control signal output step (S100), the setting value providing unit (120) outputs a setting signal in a pulse wave form by the control signal (S200: setting signal output step).

At this moment, the control unit (110) outputs the control signal to output a voltage or current signal in a pulse wave form.

Afterwards, the setting signal is applied to all the channels in the analog input module (200) either concurrently or sequentially, according to whether the setting signal is a voltage signal or a current signal in a pulse wave form (S300: setting signal applying step).

At this moment, when the setting signal is a voltage signal in a pulse wave form, each of the switches forming the relay unit (130) and respectively connected to each of the channels of the analog input module (200) is all switched-on and concurrently applies the voltage signal in a pulse wave form to all the channels of the analog input module (200).

That is, when the analog input module (200) is formed of four channels (channel 0~channel 3), the voltage signal in a pulse wave form is concurrently applied to all of the four channels (channel 0~channel 3).

Meanwhile, when the setting signal is a current signal in a pulse wave form, each of the switches forming the relay unit (130) and respectively connected to each of the channels of the analog input module (200) is sequentially switched-on and sequentially applies the current signal in a pulse wave form to all the channels of the analog input module (200).

That is, when the analog input module (200) is formed of four channels (channel 0~channel 3), the voltage signal in a pulse wave form is sequentially applied from the channel 0 to the channel 3.

Here, operating status of the switches is controlled by operating signal of the control unit (110).

That is, when the control unit (110) outputs a control signal to the setting value providing unit (120) to output a voltage signal in a pulse wave form, the control unit (110) outputs a control signal to the relay unit (130) for all the switches to be concurrently switched-on.

Meanwhile, when the control unit (110) outputs a control signal to the setting value providing unit (120) to output a current signal in a pulse wave form, the control unit (110) outputs a control signal to the relay unit (130) for all the switches to be sequentially switched-on.

Afterwards, the setting signal is applied to the analog input module (200) by the setting signal applying step (S300), the analog input module (200) sets an offset value and a gain value by the setting signal (S400: setting step).

At this moment, a maximum value of the setting signal is set as a gain value, and a minimum value of the setting signal is set as an offset value.

FIG. 6 is a table comparing offset and gain setting of an analog input module according to a conventional art and an exemplary embodiment of the present disclosure. Consumed setting times of the conventional art and the exemplary embodiment of the present disclosure when input range of the analog input module formed of four channels are 0~5V, −10~10V, and 0~20 mA, respectively.

As shown in FIG. 6, the exemplary embodiments of the present disclosure can consume significantly less setting time compared to the conventional arts.

Meanwhile, although exemplary embodiments of the present disclosure have been described in the above, however, the scope of the present disclosure is not limited by the embodiments described above. Therefore, the present disclosure may be alternatively performed in various transformation or modifications within the limit such that the differences are obvious to persons having ordinary skill in the art to which the present disclosure pertains.

The abovementioned exemplary embodiments and enclosed figures are intended to be illustrative, and not to limit the scope of the claims. The scope of protection of the present disclosure is to be interpreted by the following claims, and that all the technical ideas within the equivalent scope of the scope of the present disclosure should be construed as being included.

What is claimed is:

1. A system for setting offset and gain of an analog input module configured to set the offset and gain of the analog input module by outputting an offset value and a gain value to the analog module, using the analog module formed with a plurality of channels, the system comprising:
    a control unit configured to output a control signal for outputting the offset value and the gain value;
    a setting value providing unit configured to output a setting signal by the control signal from the control unit, wherein the setting signal is in a form of a pulse including the offset value and the gain value; and
    a relay unit configured to be switched for applying the setting signal to the analog input module by the control signal from the control unit.

2. The system of claim 1, wherein the relay unit includes:
    a plurality of positive voltage applying switches, each of the positive voltage applying switches being respectively connected to each of positive voltage terminals of the plurality of channels in the analog input module and commonly connected to the setting value providing unit through a positive voltage applying line; and
    a plurality of negative voltage applying switches, each of the negative voltage applying switches respectively being connected to each of negative voltage terminals of the plurality of channels in the analog input module and commonly connected to the setting value providing unit through a negative voltage applying line.

3. The system of claim 2, wherein the setting signal is a voltage signal in a pulse wave form, and
    the plurality of positive voltage applying switches and negative voltage applying switches are configured to be all switched-on and apply the voltage signal in a pulse wave form to the plurality of channels in the analog input module.

4. The system of claim 2, wherein the setting signal is a current signal in a pulse wave form, and
    a pair of a positive voltage applying switch and a negative voltage applying switch with respect to one channel from the plurality of positive voltage applying switch and negative voltage applying switch are configured to be switched-on and apply the current voltage signal in a pulse wave form to the channel.

5. The system of claim 4, wherein each of the plurality of positive voltage applying switches and negative voltage applying switches is configured to be sequentially switched-on and apply the current voltage signal in a pulse wave form to the plurality of channels in the analog input module.

6. The system of claim 1, wherein
    a maximum value of the setting signal in a form of pulse is set as a gain value, and
    a minimum value of the setting signal in a form of pulse is set as an offset value.

* * * * *